(12) United States Patent
Huang et al.

(10) Patent No.: US 11,502,090 B2
(45) Date of Patent: Nov. 15, 2022

(54) LOW-COST AND LOW-VOLTAGE ANTI-FUSE ARRAY

(71) Applicant: YIELD MICROELECTRONICS CORP., Chu-Pei (TW)

(72) Inventors: Wen-Chien Huang, Chu-Pei (TW); Yu Ting Huang, Chu-Pei (TW); Chi Pei Wu, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 169 days.

(21) Appl. No.: 17/248,744

(22) Filed: Feb. 5, 2021

(65) Prior Publication Data
US 2022/0181337 A1  Jun. 9, 2022

(30) Foreign Application Priority Data
Dec. 9, 2020  (TW) .................................. 109143386

(51) Int. Cl.
*H01L 27/112* (2006.01)
(52) U.S. Cl.
CPC .............................. *H01L 27/11206* (2013.01)

(58) Field of Classification Search
CPC ........... H01L 27/11206; H01L 23/5252; H01L 27/0207; G11C 17/16
See application file for complete search history.

(56) References Cited

U.S. PATENT DOCUMENTS

| | | | |
|---|---|---|---|
| 9,123,572 B2 * | 9/2015 | Kurjanowicz | .... H01L 27/11206 |
| 11,424,252 B2 * | 8/2022 | Huang | .............. H01L 27/11206 |

\* cited by examiner

*Primary Examiner* — Allison Bernstein
(74) *Attorney, Agent, or Firm* — Rosenberg, Klein & Lee

(57) ABSTRACT

A low-cost and low-voltage anti-fuse array includes a plurality of sub-memory arrays. In each sub-memory array, the anti-fuse transistor of all anti-fuse memory cells includes an anti-fuse gate commonly used by other anti-fuse transistors. These anti-fuse memory cells are arranged side by side between two adjacent bit-lines, wherein the anti-fuse memory cells in the same row are connected to different bit-lines, and all anti-fuse memory cells are connected to the same selection-line and different word-lines. The present invention utilizes the configuration of common source contacts to achieve a stable source structure and reduce the overall layout area, and meanwhile minimizes the types of control voltage to reduce leakage current.

20 Claims, 5 Drawing Sheets

LOW-COST AND LOW-VOLTAGE ANTI-FUSE ARRAY

BACKGROUND OF THE INVENTION

This application claims priority of Application No. 109143386 filed in Taiwan on 9 Dec. 2020 under 35 U.S.C. § 119; the entire contents of all of which are hereby incorporated by reference.

FIELD OF THE INVENTION

The present invention relates to an anti-fuse transistor, and more particularly to a low-cost and low-voltage anti-fuse array.

DESCRIPTION OF THE PRIOR ART

The anti-fuse transistor mainly uses a capacitive method to add a dielectric layer between two conductors. When writing is performed, a bias is applied to the conductors at both ends in order to make the dielectric layer breakdown and therefore being punctured through. After the writing is done, the resistance value of anti-fuse will decrease. With the rapid development of integrated circuits, the size of components tends to have a reduced design. In recent years, using MOS components to make anti-fuse transistors has been developed. The writing method thereof is mainly substrated on the breakdown mechanism of the gate dielectric layer. Since the anti-fuse transistor forms a permanent conductive path substrated on the rupture of the gate dielectric layer, one limitation is that a voltage large enough to puncture through the gate dielectric layer must be applied. However, in traditional anti-fuse transistors, the intersecting place of the anti-fuse gate and the gate dielectric layer is mostly a flat surface, and its charge density is uniformly distributed. In order to achieve the purpose of puncturing through the gate dielectric layer, high voltage is required, raising the need for higher current and in a larger component area.

The applicant of this disclosure has proposed a low-voltage anti-fuse component and array. Please refer to FIG. 1. The anti-fuse gate 2 of each anti-fuse memory cell 1 is designed to be commonly used by four gate dielectric layers 3, so that the boundary between the anti-fuse gate 2 and the gate dielectric layer 3 forms a protruding corner. Under the principle of tip discharging, the breakdown voltage, the current consumption and the component area can be reduced accordingly. When performing a write operation, the selection-line SL1 or SL2 is connected to ground in order to select an upper or lower anti-fuse memory cell 1. On the other hand, a low voltage is provided to the bit-line BL1 and the word-line WL1 or WL2, in order to select a specific anti-fuse memory cell 1 within a row of an array puncture through the gate dielectric layer 3. However, when this anti-fuse array selects an anti-fuse memory cell 1 for writing, other unselected anti-fuse memory cells 1 are susceptible to the selection bias voltage, which may cause leakage current to flow to the anti-fuse memory cell through the unselected bit-line BL1. In this way, the source structure is not stable enough, thereby raising the cost.

SUMMARY OF THE INVENTION

Aiming at solving the above problem, the main objective of the present invention is to provide a low-cost and low-voltage anti-fuse array, which utilizes the configuration of common source contacts to reduce the cell area, stabilize the source structure and reduce costs. In addition, the present invention may further minimize the types of control voltages to avoid the occurrence of leakage current.

To achieve the above objective, the present invention provides a low-cost and low-voltage anti-fuse array, which comprises a plurality of parallel bit-lines, a plurality of parallel word-lines, a plurality of parallel selection-lines and a plurality of sub-memory arrays. The parallel bit-lines comprises adjacent first bit-line and second bit-line; the parallel word-lines are perpendicular to the bit-lines and comprise a first word-line, a second word-line, a third word-line and a fourth word-line; the parallel selection-lines are parallel to the word-lines and comprise a first selection-line; and each of the sub-memory arrays comprises a first anti-fuse memory cell, a second anti-fuse memory cell, a third anti-fuse memory cell and a fourth anti-fuse memory cell. The first anti-fuse memory cell is connected to the first word-line, the first selection-line and the first bit-line. The second anti-fuse memory cell is connected to the second word-line, the first selection-line and the second bit-line, wherein the first anti-fuse memory cell and the second anti-fuse memory cell are adjacent to each other along the horizontal direction. The third anti-fuse memory cell is connected to the third word-line, the first selection-line and the first bit-line, wherein the third anti-fuse memory cell and the first anti-fuse memory cell are adjacent to each other along the vertical direction. The fourth anti-fuse memory cell is connected to the fourth word-line, the selection-line and the second bit-line, wherein the fourth anti-fuse memory cell is located at an intersection of the horizontal direction of the third anti-fuse memory cell and the vertical direction of the second anti-fuse memory cell, and the first, second, third and fourth anti-fuse memory cell are located between the first bit-line and the second bit-line. Each of the first, second, third and fourth anti-fuse memory cell has an anti-fuse transistor, and only one of the corners of a first gate dielectric layer of the anti-fuse transistor overlaps an anti-fuse gate.

The first, second, third and fourth anti-fuse memory cells all comprise an anti-fuse transistor. The first gate dielectric layer of the anti-fuse transistor only has one corner that overlaps the anti-fuse gate. In one embodiment, each of the four corners of the anti-fuse gate of the anti-fuse transistor overlaps with a corner of a different first gate dielectric layer, making the anti-fuse gate shared by four first gate dielectric layers. Specifically, each intersection of the anti-fuse gate and each first gate dielectric layer has a protruding corner. During operation, the charge density at the protruding corner is higher and therefore can reduce the puncturing voltage and thereby lower the current requirement of programming the anti-fuse memory cell, and meanwhile also reduce the area of components.

Specific embodiments and drawings are utilized in the follow for better understanding of the objective, technical contents, characteristics and the achieved effects of the present invention.

DESCRIPTION OF THE PREFERRED EMBODIMENTS

Figure 1:
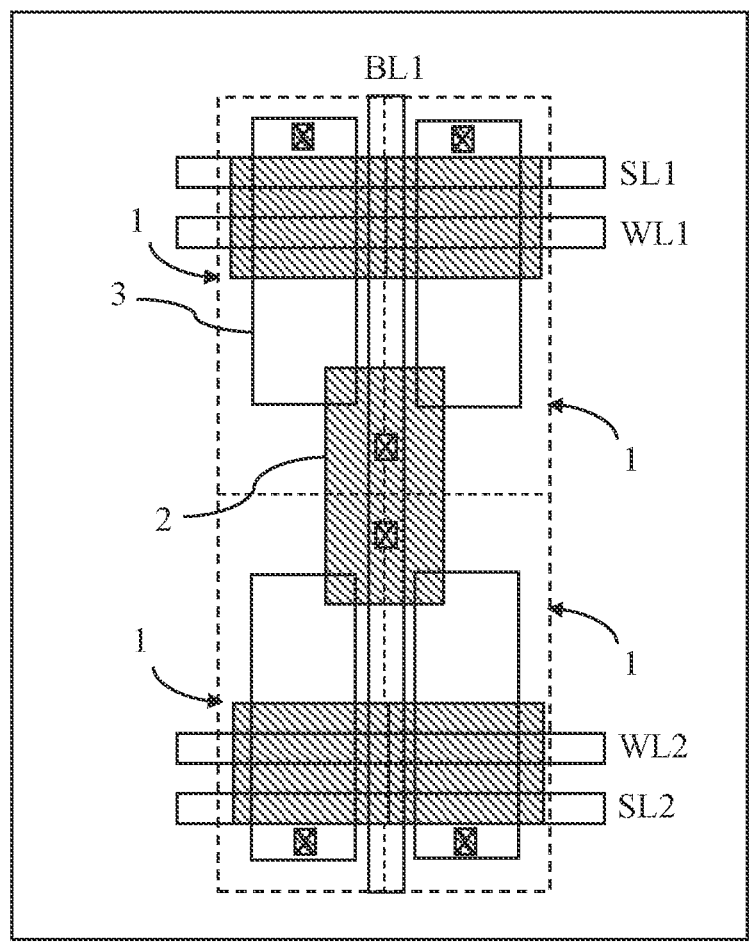
FIG. 1 is a diagram illustrating the planar layout of a related art anti-fuse array.
Figure 2:
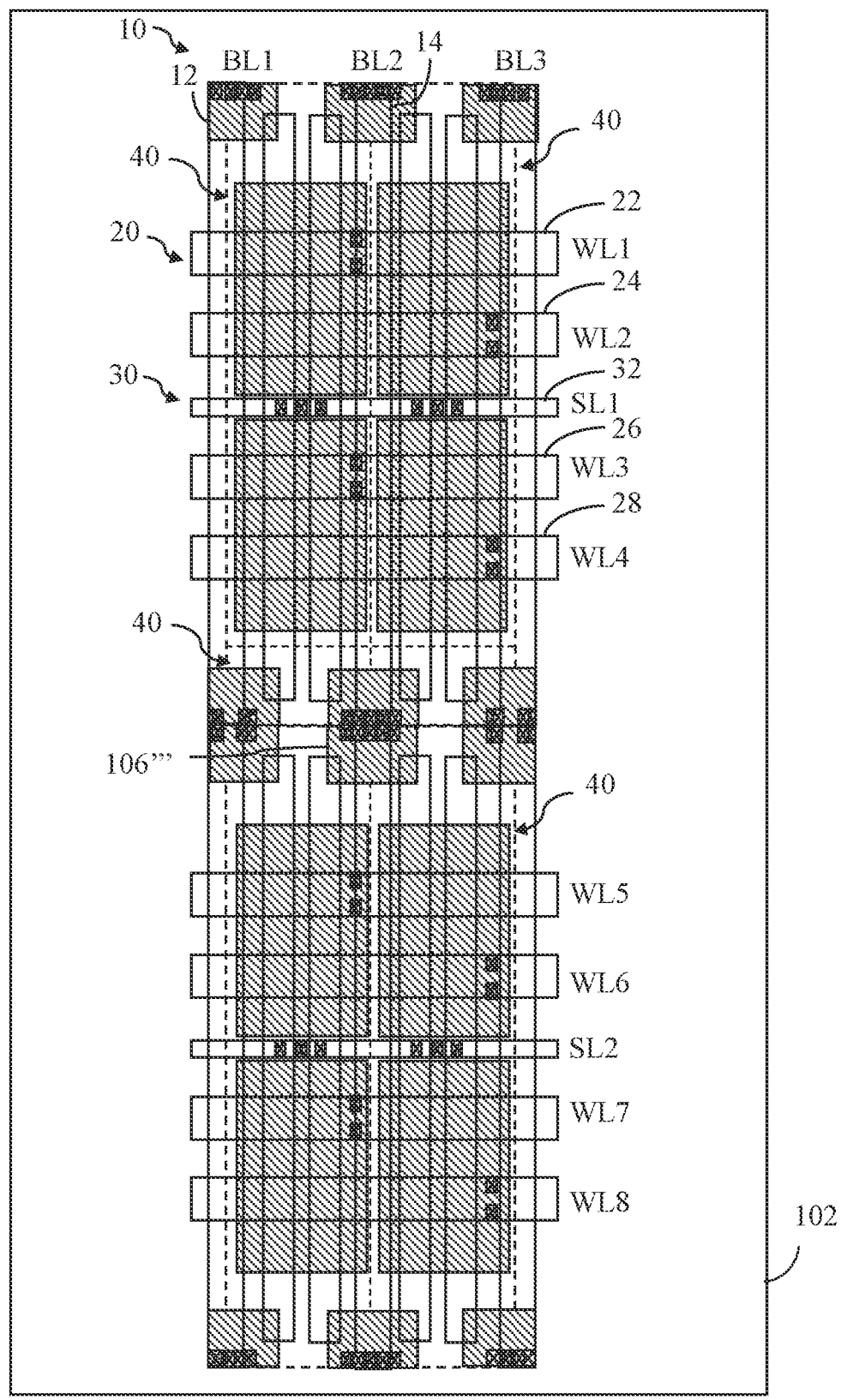
FIG. 2 is a diagram illustrating the planar layout of a low-cost and low-voltage anti-fuse array according to an embodiment of the present invention.

Please refer to FIG. 2. The low-cost and low-voltage anti-fuse array provided by the embodiment of the present invention comprises a plurality of parallel bit-lines 10. The bit-lines 10 comprises the bit-lines BL1-BL3, wherein the bit-line BL1 is further defined as the first bit-line 12, and the bit-line BL2 is further defined as the second bit-line 14. There is also a plurality of parallel word-lines 20 perpendicular to the bit-line 10, including the word-lines WL1-WL8, wherein the word-lines WL1, WL2, WL3 and WL4 are defined as the first word-line 22, second word-line 24, third word-line 26 and fourth word-line 28, respectively. There are a plurality of parallel selection-lines 30 parallel to the word-line 20, including the selection-lines SL1 and SL2, wherein the selection-line SL1 is further defined as the first selection-line 32. The above bit-line 10, word-line 20 and selection-line 30 are connected to a plurality of sub-memory array 40. As shown in the figure, four sub-memory arrays 40 are arranged in a 2*2 matrix, and each sub-memory array 40 is connected to four word-lines 20, one selection-line 30 and two bit-lines 10. Since the connecting relationships between a sub-memory array 40 and word-line 20, selection-line 30 and bit-line 10 is very similar to one another, the following only describes the identical features thereof.

Figure 3:
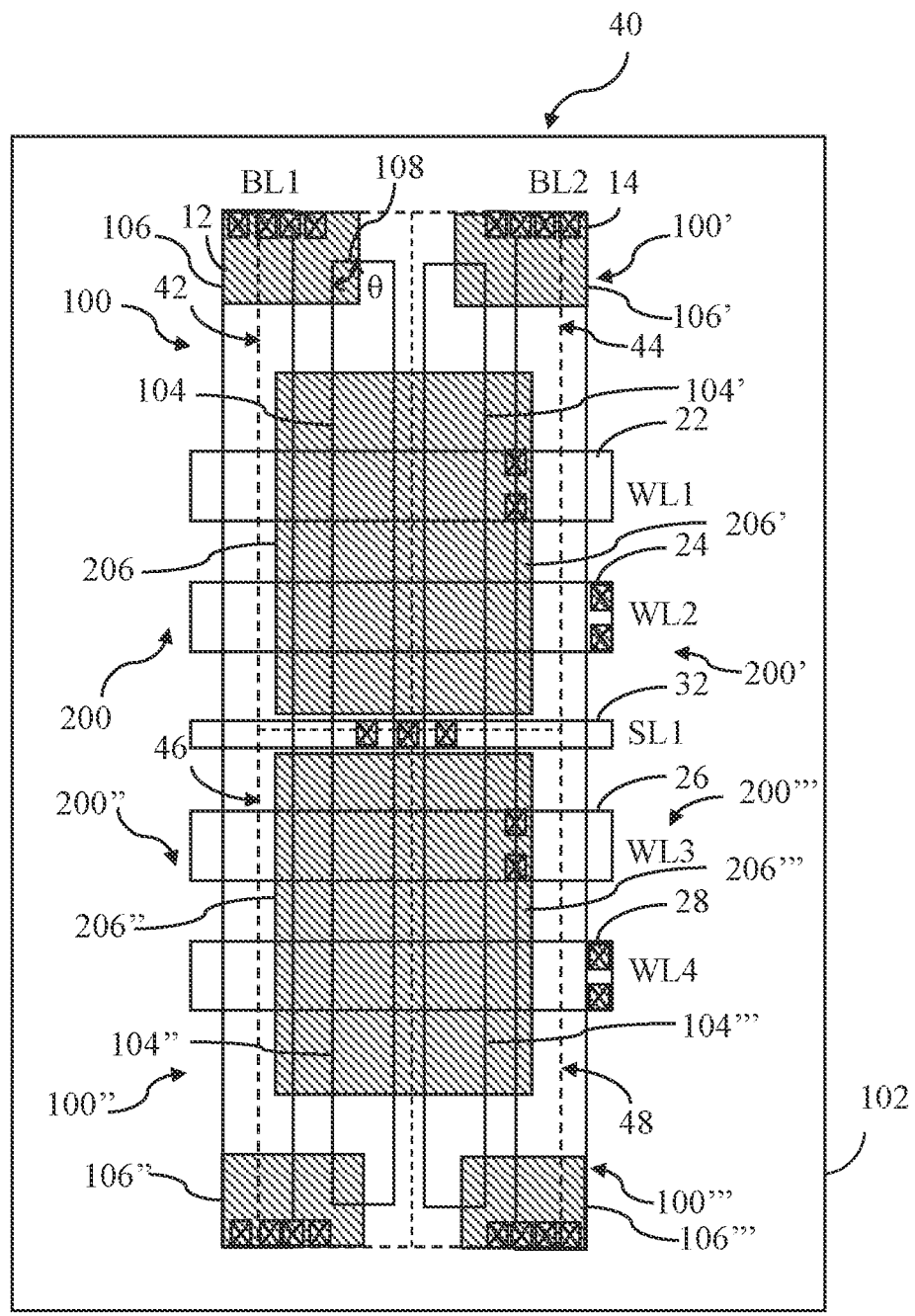
FIG. 3 is a diagram illustrating the planar layout of a sub-memory array according to an embodiment of the present invention.

Please refer to FIG. 3, each sub-memory array 40 comprises first, second, third and fourth anti-fuse memory cells 42, 44, 46 and 48 located between the first bit-line 12 and the second bit-line 14. The first anti-fuse memory cell 42 is connected to the first word-line 22, the first selection-line 32 and the first bit-line 12. The second anti-fuse memory cell 44 is connected to the second word-line 24, the first selection-line 32 and the second bit-line 14. The first and second anti-fuse memory cell 42 and 44 are adjacent to each other along the horizontal direction, i.e., they are arranged in the same row. The third anti-fuse memory cell 46 is connected to the third word-line 26, the first selection-line 32 and the first bit-line 12. The third, first anti-fuse memory cells 46, 42 are adjacent to each other along the vertical direction, i.e., they are arranged in the same column. The fourth anti-fuse memory cell 48 is connected to the fourth word-line 28, the first selection-line 32 and the second bit-line 14. The fourth anti-fuse memory cell 48 is located at the intersection of the horizontal direction of the third anti-fuse memory cell 46 and the vertical direction of the second anti-fuse memory cell 44. That is, the fourth anti-fuse memory cell 48 and the third anti-fuse memory cell 46 are arranged in different columns, and the fourth anti-fuse memory cell 48 and the second anti-fuse memory cell 44 are arranged in the same column.

Since the first anti-fuse memory cell 42 and the second anti-fuse memory cell 44 are arranged opposite to the third anti-fuse memory cell 46 and the fourth anti-fuse memory cell 48, i.e. on different sides of the first selection-line 32, and the four anti-fuse memory cells are all connected to the first selection-line 32, they can share the source contact of the first selection-line 32 due to the interconnection between the four elements. Compared to the four elements connecting to different selection-lines, the above arrangement may achieve a more stable source structure and a reduced overall layout area.

Further, the first anti-fuse memory cell 42 comprises an anti-fuse transistor 100 and a selection transistor 200 that is serially connected to the outside of the anti-fuse transistor 100. The anti-fuse transistor 100 comprises a first gate dielectric layer 104, and the first gate dielectric layer 104 is arranged on the substrate 102, and shares an anti-fuse gate 106 with other first gate dielectric layers 104, and thus only one corner of the first gate dielectric layer 104 overlaps the anti-fuse gate 106. The anti-fuse gate 106 is connected to the first bit-line 12. The first ion-doped region (not shown in the figure) is connected to the first selection-line 32. The selection gate 206 of the selection transistor 200 is connected to the first word-line 22, and the second ion-doped region (not shown in the figure) is connected to the first selection-line 32.

The second anti-fuse memory cell 44 comprises an anti-fuse transistor 100' and a selection transistor 200' that is serially-connected to the outside of the anti-fuse transistor 100'. The anti-fuse transistor 100' comprises the first gate dielectric layer 104', and the first gate dielectric layer 104' is arranged on the substrate 102 and shares an anti-fuse gate with other first gate dielectric layers, so that there is only one corner of the first gate dielectric layer 104' overlapping the anti-fuse gate 106'. The anti-fuse gate 106' is connected to the second bit-line 14. The first ion-doped region (not shown in the figure) is connected to the first selection-line 32. The selection gate 206' of the selection transistor 200' is connected to the second word-line 24, and the second ion-doped region (not shown in the figure) is connected to the first selection-line 32.

The third anti-fuse memory cell 46 comprises the anti-fuse transistor 100" and is serially-connected to the selection transistor 200" outside the anti-fuse transistor 100". The anti-fuse transistor 100" comprises a first gate dielectric layer 104", wherein the first gate dielectric layer 104" is arranged on the substrate 102 and shares one anti-fuse gate 106" with other first gate dielectric layers, so that there is only one corner of the first gate dielectric layer 104" overlapping the anti-fuse gate 106". The anti-fuse gate 106" is connected to the first bit-line 12. The first ion-doped region (not shown in the figure) is connected to the first selection-line 32. The selection gate 206" of the selection transistor 200" is connected to the third word-line 26, and the second ion-doped region (not shown in the figure) is connected to the first selection-line 32.

The fourth anti-fuse memory cell 48 comprises the anti-fuse transistor 100'" and is serially-connected to the selection transistor 200'" located outside the anti-fuse transistor 100'". The anti-fuse transistor 100'" comprises the first gate dielectric layer 104'", wherein the first gate dielectric layer 104'" is arranged on the substrate 102 and shares one anti-fuse gate 106'" with other first gate dielectric layers, so that there is only one corner of the first gate dielectric layer 104'" overlapping the anti-fuse gate 106'". The anti-fuse gate 106'" is connected to the second bit-line 14. The first ion-doped region (not shown in the figure) is connected to the first selection-line 32.

The selection gate 206'" of the selection transistor 200'" is connected to the fourth word-line 28, and the second ion-doped region (not shown in the figure) is connected to the first selection-line 32.

Figure 5:
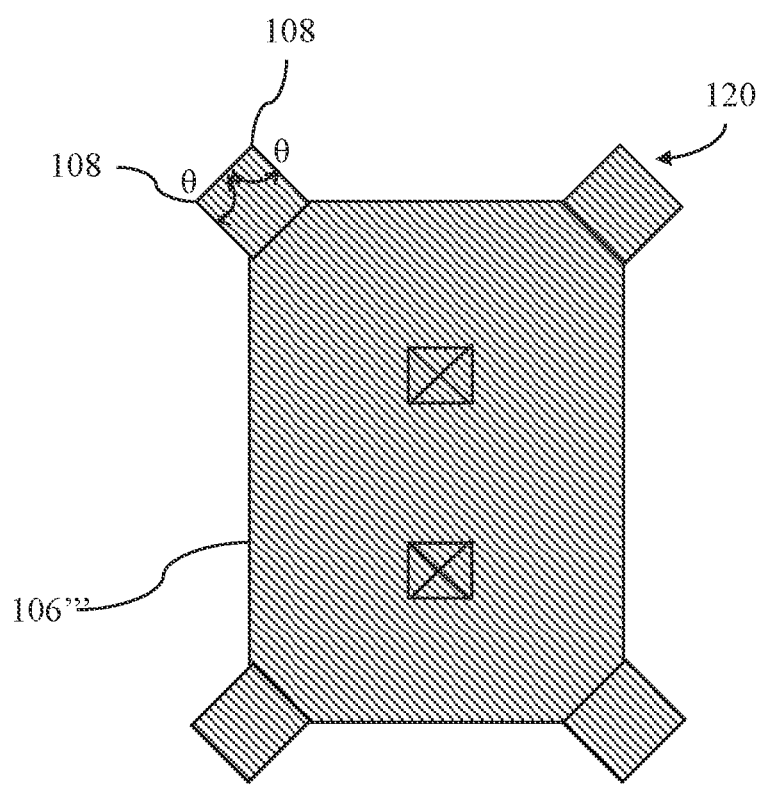
FIG. 5 is another implementation aspect of the anti-fuse gate according to an embodiment of the present invention.

In the present invention, the first, second, third, fourth anti-fuse memory cells 42, 44, 46, 48 respectively comprise the anti-fuse gates 106, 106', 106" and 106'" that are commonly used by other anti-fuse memory cells. As shown in FIG. 2, the four corners of the anti-fuse gate 106''' are connected to the corners of different first gate dielectric layers respectively, i.e. the anti-fuse gate 106''' is commonly used by four anti-fuse memory cells in the same row (according to the definition of the present invention, each of the four anti-fuse memory cells belongs to a different sub-memory array 40). More specifically, the four corners of each of the anti-fuse gates 106, 106', 106'' and 106''' in the present embodiment forms a protruding corner 108 on a corresponding different first gate dielectric layer. The angle θ of the protruding corner 108 (see FIG. 3) is preferably smaller than or equal to 90 degrees. In practice, the number of the protruding corners 108 formed in each corner may be at least one, and is preferably set to be one. However, the number of the protruding corners 108 may be multiple, and the sizes thereof are also not specifically limited but can be properly selected according to the write voltage and the thickness of the first gate dielectric layer. As shown in FIG. 5 where another implementation aspect of the anti-fuse gate 106''' is depicted, the shapes of the four corners of the anti-fuse gate 106''' respectively form an extending part 120 that protrudes outward. This extending part 120 comprises two protruding corners 108, and the angle θ of each protruding corner 108 is preferably smaller than or equal to 90 degrees. The present invention utilizes the configuration of the common anti-fuse gate to reduce the area of anti-fuse gate, and achieves the effect of reducing the overall component size.

Figure 4:
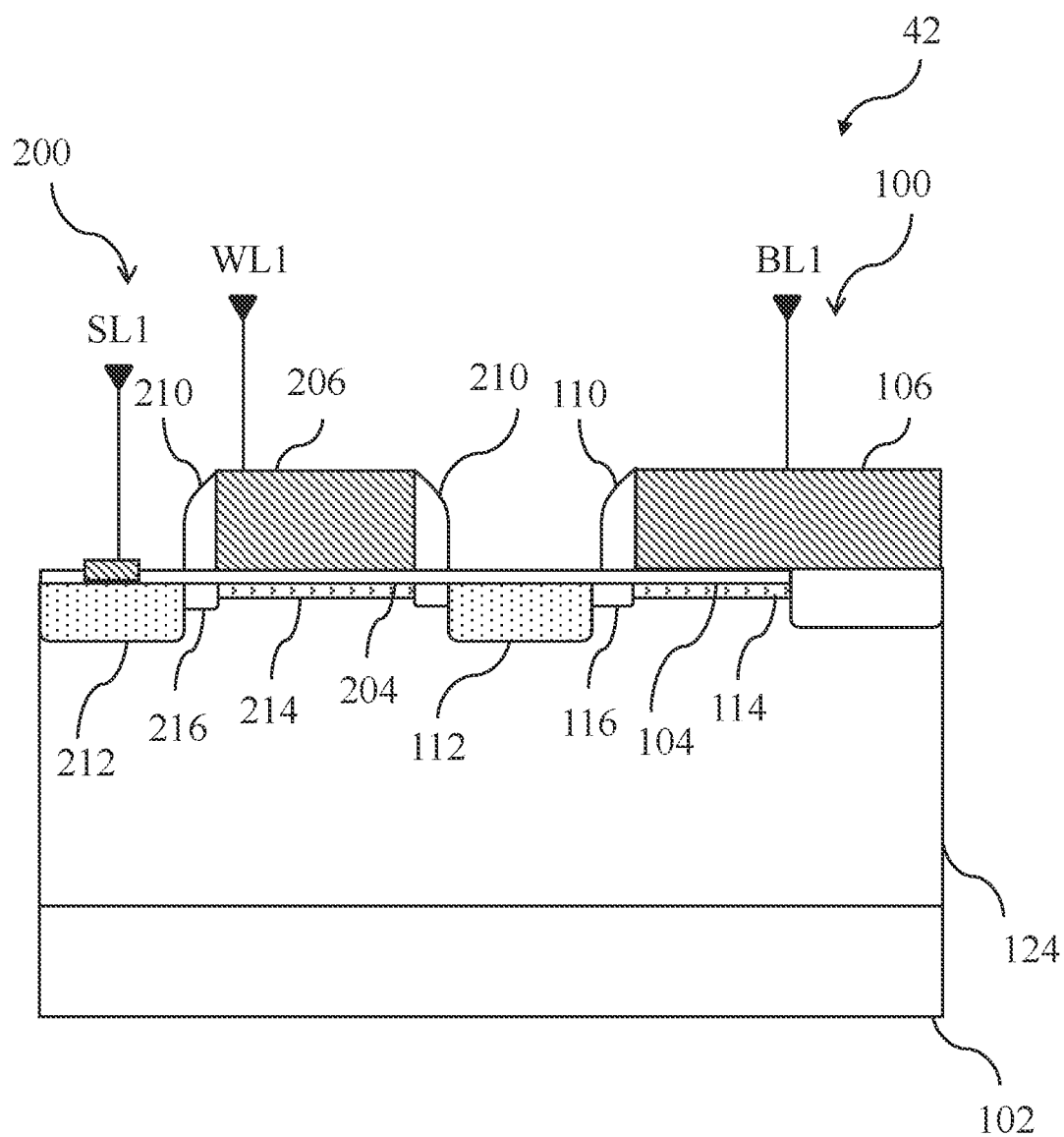
FIG. 4 is a cross-sectional view of the anti-fuse memory cell according to an embodiment of the present invention.

The detailed structures of the first, second, third, and fourth anti-fuse memory cells 42, 44, 46, and 48 are described as follows. Since the cross-sectional structure of each anti-fuse memory cell is basically the same, only the first anti-fuse memory cell 42 is illustrated in detail. As shown in FIG. 4, the anti-fuse transistor 100 and the serially connected selection transistor 200 comprise a well area 124 that is arranged on the substrate 102. The anti-fuse transistor 100 includes a first gate dielectric layer 104, a common anti-fuse gate 106, a sidewall spacer 110, a first ion-doped region 112 and a tunnel area 114. The first gate dielectric layer 104 forms on the well area 124, and the anti-fuse gate 106 is arranged on a corner of the first gate dielectric layer 104. The sidewall spacer 110 forms on the outside of the anti-fuse gate 106. The first ion-doped region 112 is formed in the well area 124 on a side of the first gate dielectric layer 104, and may comprise the lightly doped (LDD) region 116 adjacent to the vertical edge of the first gate dielectric layer 104. The selection transistor 200 includes a second gate dielectric layer 204, a selection gate 206, a sidewall spacer 210, a second ion-doped region 212 and a tunnel area 214. The second gate dielectric layer 204 is arranged on the well area 124, the second gate dielectric layer 204 is connected to the first gate dielectric layer 104, and the selection gate 206 covers the second gate dielectric layer 204, wherein the sidewall spacers 210 are formed on both sides of the selection gate 206. The first ion-doped region 112 is formed on one side of the second gate dielectric layer 204, and the second ion-doped region 212 is formed on the other side of the second gate dielectric layer 204, i.e. is formed in the well area 124 on the side of the at second gate dielectric layer 204 that is away from the first ion-doped region 112. The second ion-doped region 212 may comprise a lightly doped (LDD) region 216 adjacent to the vertical edge of the second gate dielectric layer 204. The first ion-doped region 112 and second ion-doped region 212 may be doped with the same type of ion, while the first ion-doped region 112 and the well area 124 may be doped with different types and different concentrations of ions, depending on the desired operating voltages.

In the present embodiment, the substrate 102 can be a P-type semiconductor substrate or an N-type semiconductor substrate. When the substrate 102 is a P-type semiconductor substrate, the first ion-doped region 112 and the second ion-doped region 212 are N-type doped regions and the well area 124 is a P-type doped region; when the substrate 102 is an N-type semiconductor substrate, the first ion-doped region 112 and the second ion-doped region 212 are P-type doped regions, and the well area 124 is an N-type doped region. The first gate dielectric layer 104 is a gate oxide under the anti-fuse gate 106, and is relatively thin and has a substantially uniform thickness. The material thereof can be selected from oxide layers, nitride layers, oxynitride layers, metal-oxides, etc., or their combinations. The above embodiment can be manufactured by any standard CMOS process, such as forming sidewall spacers, lightly doped (LDD) and gate siliconization. The second gate dielectric layer 204 and the first gate dielectric layer 108 are formed at the same time. Therefore, the second gate dielectric layer 204 and the first gate dielectric layer 104 comprise substantially the same composition, and may comprise the same or different degrees of thickness. When performing a write operation, the first selection-line 32 is connected to ground, and a low voltage is applied to the first bit-line 12 or the second bit-line 14 in order to select the anti-fuse memory cells 44, 48 in the right column of the sub-memory array 40 or the anti-fuse memory cells 42, 46 in the left column of the sub-memory array 40. Further, a low voltage is also provided to the first word-line 22, second word-line 24, third word-line 26 or fourth word-line 28 to select a specific anti-fuse memory cell from one column of the sub-memory array 40, in order to puncture through the first gate dielectric layer 104. For example, when the first selection-line 32 is connected to ground, a low voltage is applied to the second bit-line 14 and another low voltage is applied to the second word-line 24, the second anti-fuse memory cell 44 is used as the selected memory cell to be written.

The present invention uses the word-line to replace a selection-line to select an anti-fuse memory cell to be written, so that other anti-fuse memory cells are not affected by the selection bias and the occurrence of leakage current can be reduced. Meanwhile, the present invention uses the principle of tip discharging, which makes each corner of the anti-fuse gate comprise a protruding corner. Since charges are highly concentrated at the protruding corner which makes the electric field thereof is stronger, the write voltage required by partial breakdown of the corresponding first gate dielectric layer beneath the protruding corner can be reduced, making it easier to be punctured through, and the write time can also be shortened.

To summarize, the low cost, low voltage, and anti-fuse array provided by the present invention is substrated on a shared anti-fuse gate architecture that connects multiple anti-fuse memory cells in an array to the same selection-line and different word-lines, so as to realize a stable source structure by sharing source contacts and reduce the overall layout area. In addition, the present discourse only requires minimal control voltage and can also minimize the occurrence of leakage current, thus reducing the manufacturing costs.

The above embodiments are to illustrate the characteristics of the present invention. The purpose is to let those skilled in the art to understand and implement the content of the present invention, rather than limiting the scope of the present invention. Therefore, equivalent modifications or variations made to the present invention shall still fall within scope of the present invention.

What is claimed is:

1. A low-cost and low-voltage anti-fuse array, comprising:
a plurality of parallel bit-lines, comprising adjacent first bit-line and second bit-line;
a plurality of parallel word-lines, perpendicular to the bit-lines and comprising a first word-line, a second word-line, a third word-line and a fourth word-line;
a plurality of parallel selection-lines, parallel to the word-lines and comprising a first selection-line; and
a plurality of sub-memory arrays, each of the sub-memory arrays comprising:
a first anti-fuse memory cell connected to the first word-line, the first selection-line and the first bit-line;
a second anti-fuse memory cell connected to the second word-line, the first selection-line and the second bit-line, wherein the first anti-fuse memory cell and the second anti-fuse memory cell are adjacent to each other along the horizontal direction;
a third anti-fuse memory cell connected to the third word-line, the first selection-line and the first bit-line, wherein the third anti-fuse memory cell and the first anti-fuse memory cell are adjacent to each other along the vertical direction; and
a fourth anti-fuse memory cell connected to the fourth word-line, the first selection-line and the second bit-line, wherein the fourth anti-fuse memory cell is located at an intersection of the horizontal direction of the third anti-fuse memory cell and the vertical direction of the second anti-fuse memory cell, and the first, second, third and fourth anti-fuse memory cell are located between the first bit-line and the second bit-line;
wherein each of the first, second, third and fourth anti-fuse memory cell has an anti-fuse transistor, and only one of corners of a first gate dielectric layer of the anti-fuse transistor overlaps an anti-fuse gate.

2. The low-cost and low-voltage anti-fuse array according to claim 1, wherein each of four corners of the anti-fuse gate overlaps a corner of a different first gate dielectric layer.

3. The low-cost and low-voltage anti-fuse array according to claim 2, wherein each of the four corners of the anti-fuse gate forms at least one protruding corner which is smaller than or equal to 90 degrees.

4. The low-cost and low-voltage anti-fuse array according to claim 3, wherein each of the four corners of the anti-fuse gate forms an extending part which has two protruding corners.

5. The low-cost and low-voltage anti-fuse array according to claim 1, wherein the first anti-fuse memory cell comprises the anti-fuse transistor and a selection transistor, and the anti-fuse transistor comprises:
the anti-fuse gate, arranged on a substrate and connected to the first bit-line;
the first gate dielectric layer, arranged between the anti-fuse gate and the substrate; and
a first ion-doped region, arranged in the substrate on one side of the first gate dielectric layer, and connected to the first selection-line;
wherein the selection transistor comprises:
a selection gate, arranged on the substrate and connected to the first word-line;
a second gate dielectric layer, arranged between the selection gate and the substrate; and
a second ion-doped region, arranged in the substrate on the one side of the second gate dielectric layer that is away from the first ion-doped region, wherein the second ion-doped region is connected to the first selection-line, and the second ion-doped region is doped with the same type of ion of the first ion-doped region.

6. The low-cost and low-voltage anti-fuse array according to any of claim 5, wherein the substrate is a P-type semiconductor substrate, and the ion-doped regions are N-type doped regions.

7. The low-cost and low-voltage anti-fuse array according to any of claim 5, wherein the substrate is an N-type semiconductor substrate, and the ion-doped regions are P-type doped regions.

8. The low-cost and low-voltage anti-fuse array according to any of claim 5, further comprising a well area arranged inside the substrate and located beneath the first ion-doped regions, wherein the well area is doped with a different type of ion of the first ion-doped region.

9. The low-cost and low-voltage anti-fuse array according to claim 1, wherein the second anti-fuse memory cell comprises the anti-fuse transistor and a selection transistor, and the anti-fuse transistor comprises:
the anti-fuse gate, arranged on a substrate and connected to the second bit-line;
the first gate dielectric layer, arranged between the anti-fuse gate and the substrate; and
a first ion-doped region, arranged in the substrate on one side of the first gate dielectric layer, and connected to the first selection-line;
wherein the selection transistor comprises:
a selection gate, arranged on the substrate and connected to the second word-line;
a second gate dielectric layer, arranged between the selection gate and the substrate; and
a second ion-doped region, arranged in 的 the substrate on one side of the second gate dielectric layer that is away from the first ion-doped region, wherein the second ion-doped region is connected to the first selection-line, and the second ion-doped region is doped with the same type of ion of the first ion-doped region.

10. The low-cost and low-voltage anti-fuse array according to any of claim 9, wherein the substrate is a P-type semiconductor substrate, and the ion-doped regions are N-type doped regions.

11. The low-cost and low-voltage anti-fuse array according to any of claim 9, wherein the substrate is an N-type semiconductor substrate, and the ion-doped regions are P-type doped regions.

12. The low-cost and low-voltage anti-fuse array according to any of claim 9, further comprising a well area arranged inside the substrate and located beneath the first ion-doped regions, wherein the well area is doped with a different type of ion of the first ion-doped region.

13. The low-cost and low-voltage anti-fuse array according to claim 1, wherein the third anti-fuse memory cell comprises the anti-fuse transistor and a selection transistor, and the anti-fuse transistor comprises:
the anti-fuse gate, arranged on a substrate and connected to the first bit-line;
the first gate dielectric layer, arranged between the anti-fuse gate and the substrate; and
a first ion-doped region, arranged in the substrate on the one side of the first gate dielectric layer, wherein the first ion-doped region is connected to the first selection-line;
wherein the selection transistor comprises:

a selection gate, arranged on the substrate and connected to the third word-line;

a second gate dielectric layer, arranged between the selection gate and the substrate; and a second ion-doped region, arranged in the substrate on the one side of the second gate dielectric layer that is away from the first ion-doped region, wherein the second ion-doped region is connected to the first selection-line, and the second ion-doped region is doped with the same type of ion of the first ion-doped region.

14. The low-cost and low-voltage anti-fuse array according to any of claim 13, wherein the substrate is a P-type semiconductor substrate, and the ion-doped regions are N-type doped regions.

15. The low-cost and low-voltage anti-fuse array according to any of claim 13, wherein the substrate is an N-type semiconductor substrate, and the ion-doped regions are P-type doped regions.

16. The low-cost and low-voltage anti-fuse array according to any of claim 13, further comprising a well area arranged inside the substrate and located beneath the first ion-doped regions, wherein the well area is doped with a different type of ion of the first ion-doped region.

17. The low-cost and low-voltage anti-fuse array according to claim 1, wherein the fourth anti-fuse memory cell comprises the anti-fuse transistor and a selection transistor, and the anti-fuse transistor comprises:

the anti-fuse gate, arranged on a substrate and connected to the second bit-line;

the first gate dielectric layer, arranged between the anti-fuse gate and the substrate; and a first ion-doped region, arranged in the substrate on one side of the first gate dielectric layer, and connected to the first selection-line;

wherein the selection transistor comprises:

a selection gate, arranged on the substrate and connected to the fourth word-line;

a second gate dielectric layer, arranged between the selection gate and the substrate; and a second ion-doped region, arranged in the substrate on one side of the second gate dielectric layer that is away from the first ion-doped region, wherein second ion-doped region is connected to the first selection-line, and the second ion-doped region is doped with the same type of ion of the first ion-doped region.

18. The low-cost and low-voltage anti-fuse array according to any of claim 17, wherein the substrate is a P-type semiconductor substrate, and the ion-doped regions are N-type doped regions.

19. The low-cost and low-voltage anti-fuse array according to any of claim 17, wherein the substrate is an N-type semiconductor substrate, and the ion-doped regions are P-type doped regions.

20. The low-cost and low-voltage anti-fuse array according to any of claim 17, further comprising a well area arranged inside the substrate and located beneath the first ion-doped regions, wherein the well area is doped with a different type of ion of the first ion-doped region.

* * * * *